United States Patent
Hashimoto et al.

(10) Patent No.: US 10,067,423 B2
(45) Date of Patent: Sep. 4, 2018

(54) ADDITIVE AND RESIST UNDERLAYER FILM-FORMING COMPOSITION CONTAINING THE SAME

(71) Applicant: NISSAN CHEMICAL INDUSTRIES, LTD., Tokyo (JP)

(72) Inventors: Yuto Hashimoto, Toyama (JP); Yasushi Sakaida, Toyama (JP); Kenji Takase, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 96 days.

(21) Appl. No.: 15/128,392

(22) PCT Filed: Feb. 25, 2015

(86) PCT No.: PCT/JP2015/055445
§ 371 (c)(1),
(2) Date: Sep. 22, 2016

(87) PCT Pub. No.: WO2015/146443
PCT Pub. Date: Oct. 1, 2015

(65) Prior Publication Data
US 2017/0108777 A1    Apr. 20, 2017

(30) Foreign Application Priority Data
Mar. 26, 2014 (JP) .................. 2014-064376

(51) Int. Cl.
*G03F 7/11* (2006.01)
*C08F 212/14* (2006.01)
(Continued)

(52) U.S. Cl.
CPC .............. *G03F 7/11* (2013.01); *C08F 212/14* (2013.01); *C08F 220/22* (2013.01);
(Continued)

(58) Field of Classification Search
CPC .............................. G03F 7/11; C08F 2220/382
See application file for complete search history.

(56) References Cited

U.S. PATENT DOCUMENTS 4,940,760 A    7/1990  Boettcher et al.
5,356,979 A *  10/1994 Tai .......................... C08F 12/14
                                                    523/122
(Continued)

FOREIGN PATENT DOCUMENTS

JP    H06-73130 A    3/1994
JP    H06-130706 A   5/1994
(Continued)

OTHER PUBLICATIONS

"Protecting group", WIkipedia, 5 pages Retrieved from "https://en.wikipedia.org/w/index.php?title=Protecting_group&oldid=802394254" page last edited Sep. 25, 2017.*
(Continued)

*Primary Examiner* — Cynthia Hamilton
(74) *Attorney, Agent, or Firm* — Oliff PLC

(57) ABSTRACT

An additive for a resist underlayer film-forming composition containing a copolymer having structural units of Formulae (1) to (4), and a resist underlayer film-forming composition containing the additive:

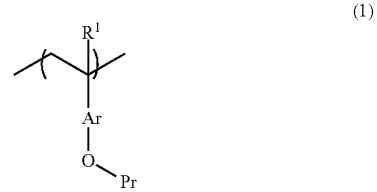

(1)

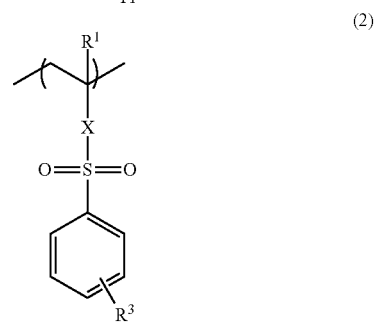

(2)

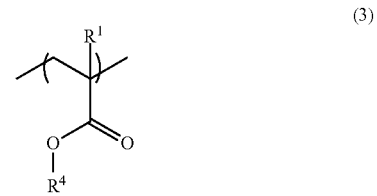

(3)

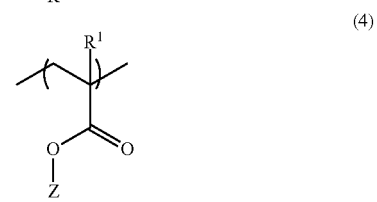

(4)

(where each $R^1$ is independently a hydrogen atom or methyl group, Ar is arylene group, Pr is a protecting group or a hydrogen atom, X is a direct bond or a —C(=O)O—$R^2$— group, $R^2$ constituting the —C(=O)O—$R^2$— group is a $C_{1-3}$ alkylene group, the alkylene group is bonded to a sulfur atom, $R^3$ is a hydrogen atom, methyl group, methoxy group, or halogeno group, $R^4$ is a $C_{1-3}$ alkyl group in which at least one hydrogen atom is substituted with a fluoro group, and Z is an organic group having 4 to 7-membered ring lactone skeleton, adamantane skeleton, or norbornane skeleton).

10 Claims, 1 Drawing Sheet

(51) Int. Cl.

| | |
|---|---|
| G03F 7/40 | (2006.01) |
| C08F 220/38 | (2006.01) |
| C08F 220/28 | (2006.01) |
| C08F 220/22 | (2006.01) |
| C09D 7/12 | (2006.01) |
| C09D 167/02 | (2006.01) |
| G03F 7/039 | (2006.01) |
| G03F 7/16 | (2006.01) |
| G03F 7/20 | (2006.01) |
| G03F 7/38 | (2006.01) |
| G03F 7/32 | (2006.01) |
| G03F 7/09 | (2006.01) |
| C09D 7/65 | (2018.01) |

(52) U.S. Cl.
 CPC .......... *C08F 220/28* (2013.01); *C08F 220/38* (2013.01); *C09D 7/125* (2013.01); *C09D 7/65* (2018.01); *C09D 167/02* (2013.01); *G03F 7/039* (2013.01); *G03F 7/091* (2013.01); *G03F 7/094* (2013.01); *G03F 7/162* (2013.01); *G03F 7/168* (2013.01); *G03F 7/2006* (2013.01); *G03F 7/325* (2013.01); *G03F 7/38* (2013.01); *G03F 7/40* (2013.01); *C08F 2220/282* (2013.01); *C08F 2220/382* (2013.01)

(56) References Cited

U.S. PATENT DOCUMENTS

2015/0187565 A1* 7/2015 Su ................... H01L 21/0276
 438/703
2016/0147152 A1* 5/2016 Fujitani .................... G03F 7/11
 438/695
2017/0285460 A1* 10/2017 Hiromatsu ............... G03F 1/50

FOREIGN PATENT DOCUMENTS

| | | |
|---|---|---|
| JP | 2010-237491 A | 10/2010 |
| JP | 2011-164345 A | 8/2011 |
| WO | 03/017002 A1 | 2/2003 |
| WO | 2010/074075 A1 | 7/2010 |
| WO | 2013/058189 A1 | 4/2013 |

OTHER PUBLICATIONS

Protecting Groups List, SynArchive.com, The Organic Synthesis Archive, 4 pages downloaded Feb. 14, 2018.*
Gerstenberger et al "tert-Buyldiphenylsilylethyl ("TBDPSE"): A Practical Protecting Group for Phenols" J. Org. Chem. 2005, 70, 1467-1470, American Chemical Society Published on Web Jan. 14, 2005.*
Theodora W. Greene et al, Chapter 3, "Protection for Phenols and Catechols", Protective Groups in Organic Synthesis, Third Edition. Copyright 1999 John Wiley & Sons, Inc. ISBNs: 0-471-16019-9 (Hardback); 0-471-22057-4 (Electronic). pp. 246-292.*
Apr. 7, 2015 International Search Report issued in International Patent Application No. PCT/JP2015/055445.
Apr. 7, 2015 Written Opinion of the International Searching Authority issued in International Patent Application No. PCT/JP2015/055445.

* cited by examiner

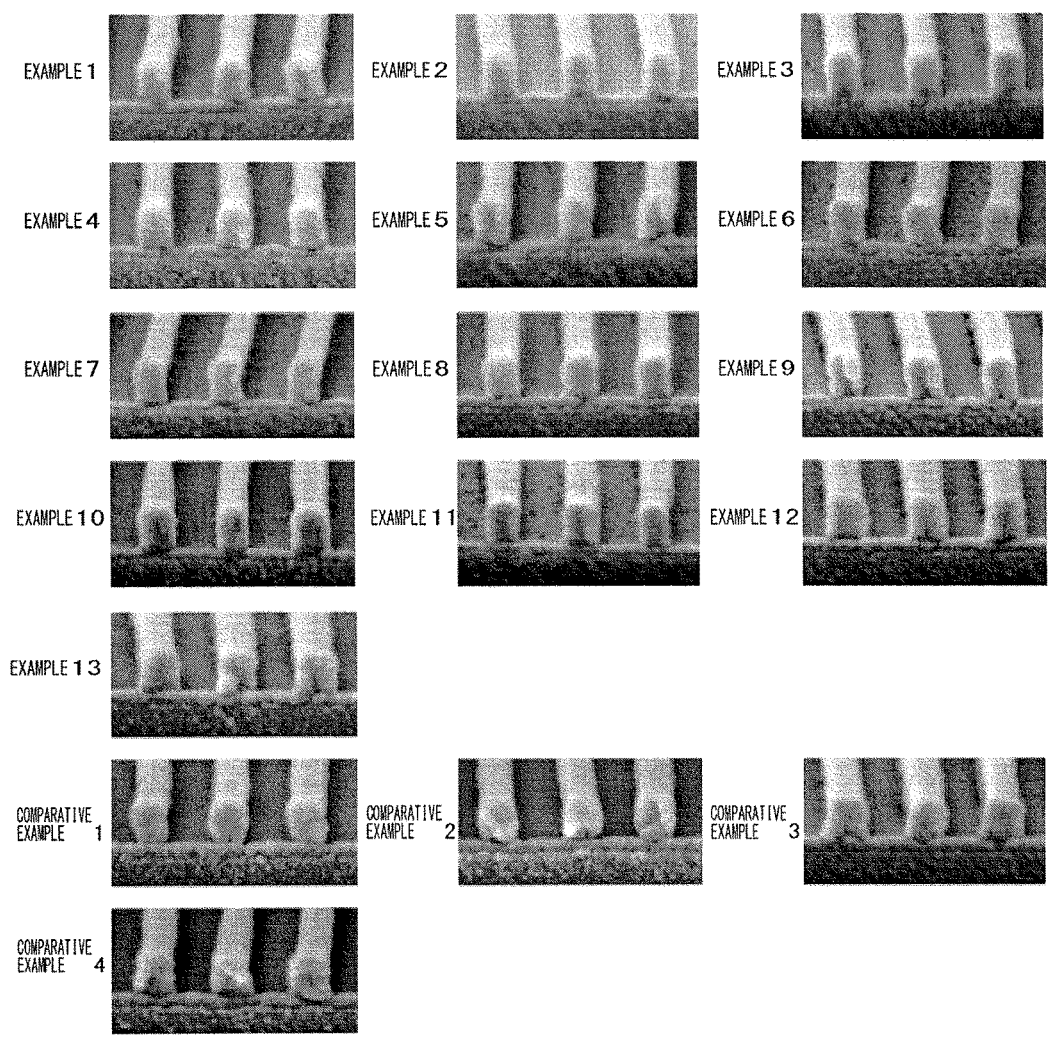

ADDITIVE AND RESIST UNDERLAYER FILM-FORMING COMPOSITION CONTAINING THE SAME

TECHNICAL FIELD

The present invention relates to an additive to be added to a resist underlayer film-forming composition. The present invention particularly relates to an additive that aims to form a resist pattern of desired shape on a resist underlayer film. Further, the present invention relates to a resist underlayer film-forming composition containing the additive.

BACKGROUND ART

In ArF immersion lithography and extreme ultraviolet light (EUV) lithography, finer processing size of a resist line width has been required. In the formation of a finer resist pattern, a contact area between the resist pattern and an underlying substrate is decreased to increase the aspect ratio of the resist pattern (height of the resist pattern/line width of the resist pattern). As a result, there is a concern that the resist pattern is likely to collapse. Therefore, in order not to cause the collapse, high adhesion to the resist pattern has been required for a resist underlayer film (anti-reflective coating) that comes into contact with the resist pattern.

In order to exhibit high adhesion to the resist pattern in the resist underlayer film, it is reported that the adhesion to the obtained resist pattern is improved by using a resist underlayer film-forming composition containing a lactone structure (Patent Document 1). That is, when a resist underlayer film-forming composition containing a polar moiety like a lactone structure is used, the adhesion to the resist pattern is improved. Accordingly, prevention of collapse of the resist pattern in the finer resist pattern is expected.

However, in a lithography process that requires the formation of a finer resist pattern, such as ArF immersion lithography and extreme ultraviolet light (EUV) lithography, it cannot be said that only the lactone structure contained in the resist underlayer film-forming composition is sufficient to prevent the collapse of the resist pattern.

In order to achieve high adhesion of the resist underlayer film to the resist pattern, Patent Document 2 describes an additive for a resist underlayer film-forming composition that can suppress a change of skirt shape of the resist pattern into an undercut shape by modifying a surface state of the resist underlayer film into a basic state. Patent Document 3 describes an additive for a resist underlayer film-forming composition that can suppress a change of skirt shape of the resist pattern into a footing shape by segregation of an additive component near the surface of the resist underlayer film.

Patent Document 4 describes a resist underlayer film-forming composition for lithography containing a copolymer having a structural unit in which a sulfo group is introduced into a terminal, a cross-linking agent, and a solvent. The invention described in Patent Document 4 exerts an effect of suppressing the generation of a sublimate derived from a cross-linking catalyst component in the formation of the resist underlayer film, and can provide a resist underlayer film capable of forming a resist pattern of good shape in which the lower portion have almost no footing shape.

PRIOR ART DOCUMENTS

Patent Documents

Patent Document 1: International publication WO 03/017002

Patent Document 2: International publication WO 2013/058189

Patent Document 3: International publication WO 2010/074075

Patent Document 4: Japanese Patent Application Publication No. 2010-237491 (JP 2010-237491 A)

SUMMARY OF THE INVENTION

Problem to be Solved by the Invention

In the formation of a resist pattern, not a method for removing an exposed area of a resist film formed from a positive resist solution by an alkaline developer in a development step, but a method for removing an unexposed area of the resist film by a solvent capable of dissolving the resist film, generally an organic solvent, and leaving the exposed area of the resist film as a resist pattern is sometimes adopted. When the latter method is adopted, it is difficult that both an effect of preventing collapse of the resist pattern and an effect of forming the cross-sectional shape of the resist pattern into a straight shape are satisfied in the prior art described above. Therefore, an object of the present invention is to provide an additive for a resist underlayer film-forming composition that can prevent the collapse of the resist pattern and form the cross-sectional shape of the resist pattern into a straight shape, and a resist underlayer film-forming composition containing the additive.

Means for Solving the Problems

A first aspect of the present invention is an additive for a resist underlayer film-forming composition containing a copolymer having structural units of Formulae (1) to (4):

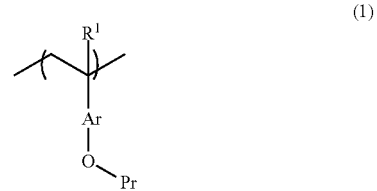

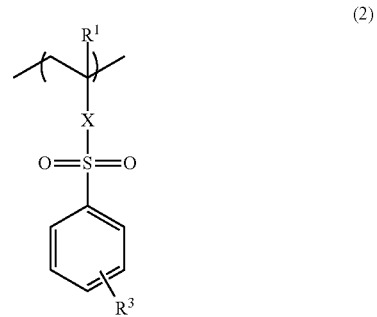

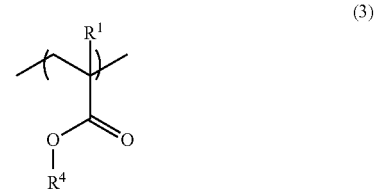

(4)

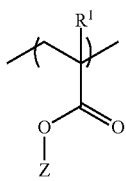

(4a)

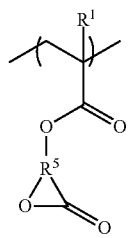

(where each R¹ is independently a hydrogen atom or methyl group, Ar is arylene group, Pr is a protecting group or a hydrogen atom, X is a direct bond or a —C(=O)O—R²— group, R² constituting the —C(=O)O—R²— group is a $C_{1-3}$ alkylene group, the alkylene group is bonded to a sulfur atom, R³ is a hydrogen atom, methyl group, methoxy group, or halogeno group, R⁴ is a $C_{1-3}$ alkyl group in which at least one hydrogen atom is substituted with a fluoro group, and Z is an organic group having 4 to 7-membered ring lactone skeleton, adamantane skeleton, or norbornane skeleton).

The protecting group is, for example, acetyl group, methoxymethyl group, ethoxyethyl group, a $C_{4-8}$ tertiary alkyl group, or pivaloyl group. In the present invention, it is preferable that the protecting group be detached by heating under an acidic condition.

The structural unit of Formula (2) is, for example, a structural unit of Formula (2a) or Formula (2b):

(2a)

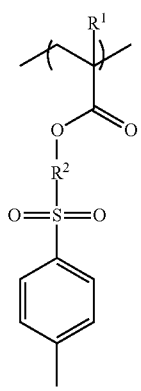

(2b)

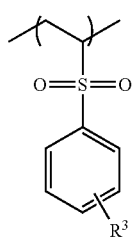

(where each R¹ is independently a hydrogen atom or methyl group, R² is a $C_{1-3}$ alkylene group, and R³ is a hydrogen atom, methyl group, methoxy group, or halogeno group).

The structural unit of Formula (4) is, for example, a structural unit of Formula (4a):

(where each R¹ is independently a hydrogen atom or methyl group, and R⁵ is a $C_{2-5}$ hydrocarbon group).

The copolymer is a compound synthesized by copolymerization of a monomer forming the structural unit of Formula (1), a monomer forming the structural unit of Formula (2), a monomer forming the structural unit of Formula (3), and a monomer forming the structural unit of Formula (4). The ratio of the monomer forming the structural unit of Formula (2) relative to a total of the four monomers of 100% by mole is, for example, 5% by mole to 40% by mole, and preferably 5% by mole to 30% by mole. When the ratio of the monomer forming the structural unit of Formula (2) is more than 40% by mole, a copolymer to be synthesized may be easily gelled. Such a copolymer has low solubility in a solvent. In contrast, when the ratio of the monomer forming the structural unit of Formula (2) is less than 5% by mole, the effects of the present invention may not be obtained.

For example, the copolymer has a weight average molecular weight of 3,000 to 20,000, and preferably 3,000 to 13,000. When the weight average molecular weight of the copolymer does not fall within the range, the skirt shape of a resist pattern to be formed is an undercut shape or a footing shape. As the weight average molecular weight of the copolymer is larger, the skirt shape is likely to be a footing shape. Therefore, the effects of the present invention cannot be obtained.

The additive according to the first aspect of the present invention may be in a solution form that further contains a solvent capable of dissolving the copolymer, and may further contain a compound used in the synthesis of the copolymer.

A second aspect of the present invention is a resist underlayer film-forming composition containing the additive of the first aspect of the present invention, a resin different from the copolymer, an organic acid, a cross-linking agent, and a solvent.

The resin is, for example, polyester. The content of the additive is, for example, 5 parts by mass to 20 parts by mass, and preferably 10 parts by mass to 15 parts by mass, relative to 100 parts by mass of the resin.

In a method for forming a resist pattern including steps of forming a resist underlayer film on a substrate, forming a resist film on the resist underlayer film, exposing the resist film through a photomask, and developing the resist film by a solvent capable of dissolving an unexposed area of the resist film after the exposure, to remove the unexposed area, the resist underlayer film-forming composition of the second aspect of the present invention is preferably used. The resist film can be formed using a publicly known positive resist solution. The solvent capable of dissolving the unexposed area of the resist film is varied depending on the resist solution used in the formation of the resist film, and a publicly known organic solvent is generally used.

Effects of the Invention

When the resist underlayer film-forming composition containing the additive according to the present invention is applied to a lithography process, the collapse of a resist pattern can be prevented, and the cross-sectional shape of the resist pattern can be formed into a straight shape. The adhesion between the resist underlayer film formed from the resist underlayer film-forming composition and the resist pattern can be improved.

MODES FOR CARRYING OUT THE INVENTION

[Copolymer]

The additive according to the first aspect of the present invention contains a copolymer having structural units of Formulae (1) to (4).

Examples of a monomer forming the structural unit of Formula (1) include p-hydroxystyrene, p-tert-butoxystyrene, m-tert-butoxystyrene, p-tert-pentyloxystyrene, p-tert-octyloxystyrene, 2-tert-butoxy-6-vinylnaphthalene, p-acetoxystyrene, 2-acetoxy-6-vinylnaphthalene, and p-(1-ethoxyethoxy)styrene.

Examples of a monomer forming the structural unit of Formula (2) include 2-tosylethyl acrylate, 2-tosylethyl methacrylate, phenyl vinyl sulfone, and p-tolyl vinyl sulfone.

Examples of a monomer forming the structural unit of Formula (3) include 2,2,2-trifluoroethyl acrylate, 2,2,2-trifluoroethyl methacrylate, 1,1,1,3,3,3-hexafluoroisopropyl acrylate, 1,1,1,3,3,3-hexafluoroisopropyl methacrylate, and methacrylic acid (1,2-difluoroethyl).

Examples of a monomer forming the structural unit of Formula (4) include γ-butyrolactone acrylate, γ-butyrolactone methacrylate, mevalonic lactone methacrylate, 1-adamantyl acrylate, 1-adamantyl methacrylate, 2-methyl-2-adamantyl acrylate, 2-methyl-2-adamantyl methacrylate, 2-ethyl-2-adamantyl acrylate, 2-ethyl-2-adamantyl methacrylate, isobornyl acrylate, and isobornyl methacrylate.

Examples of the structural unit of Formula (1) include structural units of Formulae (1-1) to (1-8). As arylene group of Ar of the structural unit of the Formula (1), phenylene group or naphthylene group is selected. The structural unit of Formula (1) is an acidic moiety.

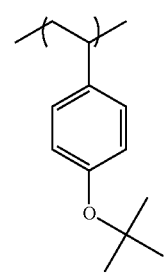

(1-1)

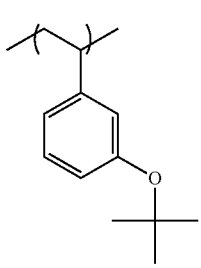

(1-2)

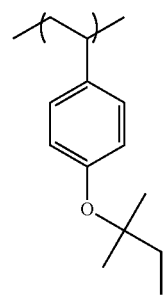

(1-3)

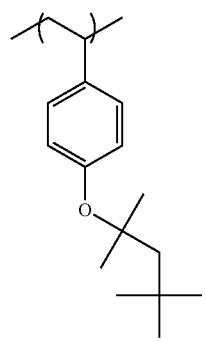

(1-4)

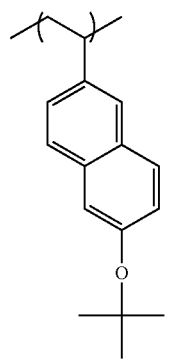

(1-5)

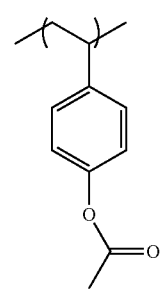

(1-6)

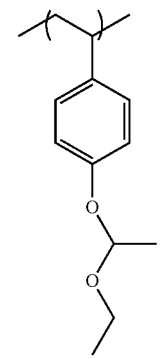

(1-7)

(1-8)

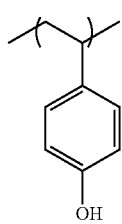

Examples of the structural unit of Formula (2) include structural units of Formulae (2-1) to (2-4). In the following Formula, only an example in which $R^3$ in the structural unit of Formula (2) is a hydrogen atom or methyl group is shown. However, when $R^3$ is halogeno group, $R^3$ is selected from the group consisting of fluoro group, chloro group, bromo group, and iodo group. The structural unit of Formula (2) is a photo acid generation moiety.

(2-1)

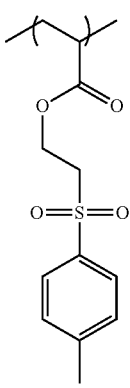

(2-2)

(2-3)

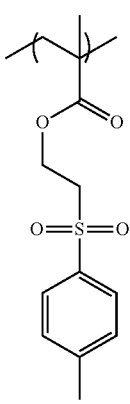

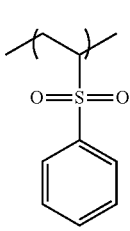

(2-4)

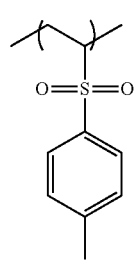

Examples of the structural unit of Formula (3) include structural units of Formulae (3-1) to (3-5). The structural unit of Formula (3) is a moiety for migrating the copolymer to a surface of the film.

(3-1)

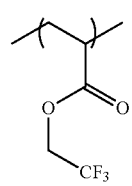

(3-2)

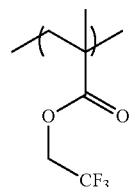

(3-3)

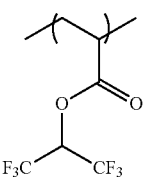

(3-4)

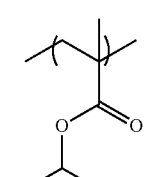

(3-5)

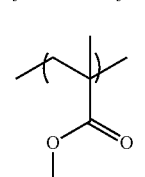

Examples of the structural unit of Formula (4) include structural units of Formulae (4-1) to (4-16). As Z of the structural unit of the Formula (4), an organic group having a skeleton (cyclic structure) that is introduced into a polymer in the resist solution is selected.

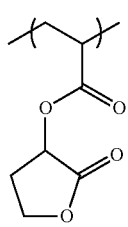
(4-1)
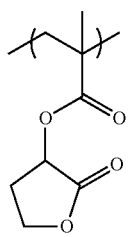
(4-2)
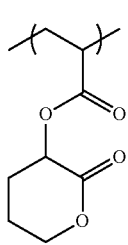
(4-3)
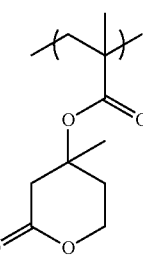
(4-4)
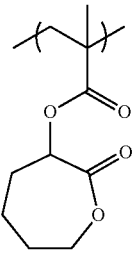
(4-5)
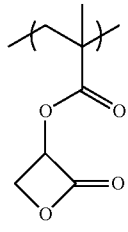
(4-6)
-continued
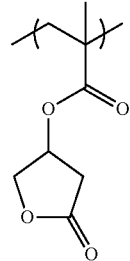
(4-7)
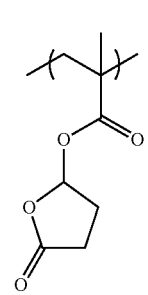
(4-8)
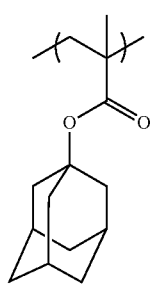
(4-9)
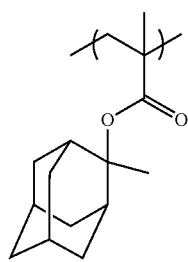
(4-10)
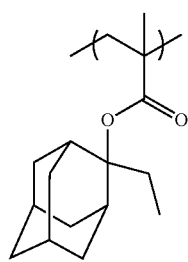
(4-11)

-continued (4-12)

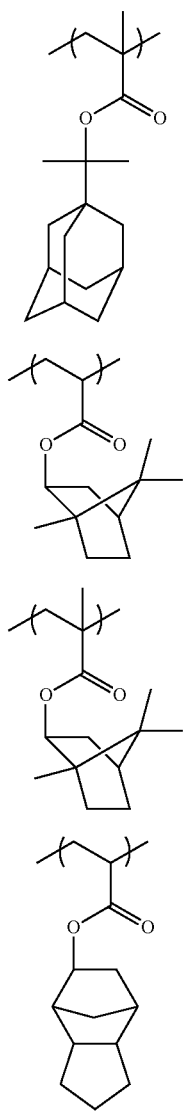

(4-13)

(4-14)

(4-15)

-continued (4-16)

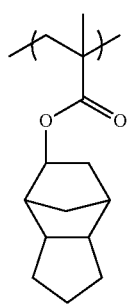

When the copolymer of the additive according to the present invention has all the structural units of Formulae (1) to (4), the acidity near the surface of the resist underlayer film formed from the resist underlayer film-forming composition containing the additive is adjusted, and the adhesion of the resist underlayer film to the resist pattern is improved. Consequently, the collapse of the resist pattern can be suppressed, and the cross-sectional shape of the resist pattern formed on the resist underlayer film can be formed into a straight shape.

[Resin]

The resist underlayer film-forming composition according to the second aspect of the present invention contains the resin different from the copolymer of the additive. The resin is not particularly limited as long as it is a polymer used in the resist underlayer film-forming composition. Examples of the resin include a polymer having a structural unit of Formula (5) and a polymer having a structural unit of Formula (6).

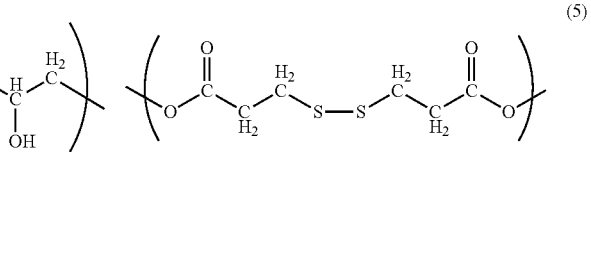

(5)

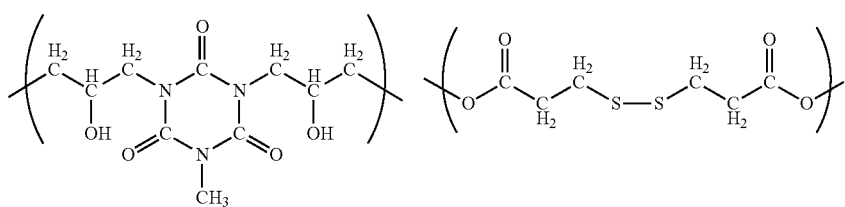

(6)

[Cross-Linking Agent]

The resist underlayer film-forming composition further contains the cross-linking agent. Examples of the cross-linking agent include hexamethoxy methyl melamine, tetramethoxymethyl benzoguanamine, 1,3,4,6-tetrakis (methoxymethyl) glycoluril (POWDERLINK (registered trademark) 1174), 1,3,4,6-tetrakis(butoxymethyl) glycoluril, 1,3,4,6-tetrakis(hydroxymethyl) glycoluril, 1,3-bis(hydroxymethyl)urea, 1,1,3,3-tetrakis(butoxymethyl)urea, and 1,1,3,3-tetrakis(methoxymethyl)urea. The content of the cross-linking agent relative to the resin is, for example, 1% by mass to 30% by mass.

[Organic Acid]

The resist underlayer film-forming composition further contains the organic acid. The organic acid is a catalyst component promoting a cross-linking reaction. Examples thereof include sulfonic acid compounds and carboxylic acid compounds including p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-phenolsulfonic acid, methyl 4-phenolsulfonate, benzenedisulfonic acid, 1-naphthalenesulfonic acid, citric acid, benzoic acid, and hydroxybenzoic acid. The composition may contain the organic acid singly or a combination of two or more thereof. The content of the organic acid relative to the cross-linking agent is, for example, 0.1% by mass to 20% by mass.

[Solvent]

The resist underlayer film-forming composition further contains the solvent. Examples of the solvent include propylene glycol monomethyl ether (PGME), propylene glycol monomethyl ether acetate (PGMEA), propylene glycol monoethyl ether, propylene glycol monopropyl ether, methyl ethyl ketone, ethyl acetate, cyclohexanone, γ-butyrolactone, N-methylpyrrolidone, and a mixture of two or more selected from the solvents. The content of the solvent relative to the resist underlayer film-forming composition is, for example, 50% by mass to 99.5% by mass.

[Other Additives]

The resist underlayer film-forming composition may further contain a surfactant, if necessary. The surfactant is an additive to improve the coating properties of the resist underlayer film-forming composition to the substrate. A publicly known surfactant such as a nonionic surfactant and a fluorosurfactant can be used. Specific examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop [registered trademark] EF301, Eftop EF303, and Eftop EF352 (available from Mitsubishi Materials Electronic Chemicals Co., Ltd.), MEGAFACE [registered trademark] F171, MEGAFACE F173, MEGAFACE R-30, MEGAFACE R-40, and MEGAFACE R-40-LM (available from DIC Corporation), Fluorad FC430 and Fluorad FC431 (available from Sumitomo 3M, Ltd.), and Asahi Guard [registered trademark] AG710, and Surflon [registered trademark] S-382, Surflon SC101, Surflon SC102, Surflon SC103, Surflon SC104, Surflon SC105, and Surflon SC106 (available from Asahi Glass Co., Ltd.), and organosiloxane polymer KP341 (available from Shin-Etsu Chemical Co., Ltd.). The composition may contain the surfactant singly or a combination of two or more thereof. When the resist underlayer film-forming composition contains the surfactant, the content of the surfactant is, for example, 0.1% by mass to 5% by mass, and preferably 0.2% by mass to 3% by mass, relative to the resin.

EXAMPLES

The average molecular weights of polymers shown in the following Synthesis Examples 1 to 15 herein are results measured by gel permeation chromatography (hereinafter abbreviated as GPC). In the measurement, a GPC device manufactured by TOSOH CORPORATION was used, and measurement conditions are as follows.

GPC column: Shodex (registered trademark) Asahipak (registered trademark) (manufactured by Showa Denko K.K.)
Column temperature: 40° C.
Solvent: N,N-dimethyl formamide (DMF)
Flow rate: 0.6 mL/min
Standard sample: polystyrene (available from TOSOH CORPORATION)

Synthesis Example 1

10.00 g of monoallyl diglycidyl isocyanurate, 7.48 g of 3,3'-dithiodipropionic acid, and 0.66 g of ethyltriphenylphosphonium bromide were dissolved in 72.94 g of propylene glycol monomethyl ether, and a reaction was carried out at 125° C. for 4 hours to obtain a solution containing a polymer (resin). The polymer in the obtained solution was analyzed by GPC. The weight average molecular weight in terms of standard polystyrene was 4,800.

Synthesis Example 2

10.00 g of monomethyl diglycidyl isocyanurate, 7.85 g of 3,3'-dithiodipropionic acid, and 0.66 g of ethyltriphenylphosphonium bromide were dissolved in 72.94 g of propylene glycol monomethyl ether, and a reaction was carried out at 105° C. for 24 hours to obtain a solution containing a polymer (resin). The polymer in the obtained solution was analyzed by GPC. The weight average molecular weight in terms of standard polystyrene was 3,400.

Synthesis Example 3

60.00 g of 2-tosylethanol, 45.48 g of triethylamine, 0.007 g of hydroquinone, and 180 g of acetone were placed in a 500-mL four necked flask and stirred at 5° C. To the stirred mixture, 46.98 g of methacrylic acid chloride was added dropwise, and the mixture was heated to 25° C. and further stirred for 1 hour. The resulting salt was collected by filtration, washed with 60 g of acetone, and the filtrate was collected. The collected filtrate was added dropwise to 300 g of water, to deposit a solid. The solid was washed with 120 g of water, and dried under reduced pressure, to obtain a crude product. To the obtained crude product, 300 g of heptane and 90 g of ethyl acetate were added, and dissolved by heating at 70° C. An undissolved substance was removed by filtration. To the filtrate, 60 g of heptane was added dropwise, and the mixture was gradually cooled, resulting in recrystallization. The obtained solid was washed with 60 g of heptane, and dried under reduced pressure, to obtain 2-tosylethyl methacrylate as a desired product.

Synthesis Example 4

2.70 g (45% by mole) of p-tert-butoxystyrene, 0.30 g (5% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 9,800.

Synthesis Example 5

2.40 g (40% by mole) of p-tert-butoxystyrene, 1.50 g (10% by mole) of 2-tosylethyl methacrylate obtained in Synthesis Example 3, 0.60 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 5,600.

Synthesis Example 6

1.80 g (30% by mole) of p-tert-butoxystyrene, 1.20 g (20% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 7,800.

Synthesis Example 7

1.50 g (25% by mole) of p-tert-butoxystyrene, 1.50 g (25% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 7,400.

Synthesis Example 8

1.20 g (20% by mole) of p-tert-butoxystyrene, 1.80 g (30% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 7,300.

Synthesis Example 9

1.50 g (25% by mole) of p-tert-butoxystyrene, 1.50 g (25% by mole) of 2-tosylethyl methacrylate obtained in Synthesis Example 3, 2.40 g (40% by mole) of 2,2,2-trifluoroethyl methacrylate, 0.60 g (10% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 6,300.

Synthesis Example 10

1.50 g (25% by mole) of p-tert-butoxystyrene, 1.50 g (25% by mole) of 2-tosylethyl methacrylate obtained in Synthesis Example 3, 1.80 g (30% by mole) of 2,2,2-trifluoroethyl methacrylate, 1.20 g (20% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 5,500.

Synthesis Example 11

1.50 g (25% by mole) of p-tert-butoxystyrene, 1.50 g (25% by mole) of 2-tosylethyl methacrylate obtained in Synthesis Example 3, 0.60 g (10% by mole) of 2,2,2-trifluoroethyl methacrylate, 2.40 g (40% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 5,900.

Synthesis Example 12

1.50 g (25% by mole) of p-tert-butoxystyrene, 1.50 g (25% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.45 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 4,700.

Synthesis Example 13

1.50 g (25% by mole) of p-tert-butoxystyrene, 1.50 g (25% by mole) of 2-tosylethyl methacrylate obtained in Synthesis Example 3, 1.20 g (20% by mole) of 2,2,2-trifluoroethyl methacrylate, 1.80 g (30% by mole) of γ-butyrolactone methacrylate, and 0.23 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 9,700.

Synthesis Example 14

1.50 g (25% by mole) of p-tert-butoxystyrene, 1.50 g (25% by mole) of phenyl vinyl sulfone, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 4,300.

Synthesis Example 15

3.00 g (50% by mole) of p-tert-butoxystyrene, 1.20 g (20% by mole) of 2,2,2-trifluoroethyl methacrylate, 1.80 g (30% by mole) of γ-butyrolactone methacrylate, and 0.30 g of azobisisobutyronitrile were dissolved in 12.60 g of propylene glycol monomethyl ether. The solution was slowly added dropwise to 12.60 g of propylene glycol monomethyl ether heated to 100° C. After the dropwise addition, a reaction was carried out at 100° C. for 2 hours to obtain a solution containing a polymer (copolymer). The polymer in the obtained solution was analyzed by GPC. The weight average molecular weight in terms of standard polystyrene was 19,800. The polymer obtained in this Synthesis Example was a copolymer having no structural unit of Formula (2).

The resin obtained in Synthesis Example 1 or 2, one of the copolymers obtained in Synthesis Examples 4 to 15 as an additive, a cross-linking agent, an organic acid, a surfactant, and a solvent were mixed at a ratio shown in Table 1, to prepare each of resist underlayer film-forming compositions of Examples 1 to 13 and Comparative Examples 1 to 4. The amount of the additive shown in Table 1 was not the amount of the polymer solution, and was the amount of the added polymer (copolymer) itself. In Table 1, tetramethoxymethyl glycoluril (trade name: POWDERLINK (registered trademark) 1174, available from Nihon Cytec Industries Inc.) is abbreviated as "PL-LI," 4-phenolsulfonic acid is abbreviated as "PSA," 5-sulfosalicylic acid is abbreviated as "5-SSA," methyl 4-phenolsulfonate is abbreviated as "MSP," MEGAFACE (registered trademark) R-40 (available from DIC Corporation) is abbreviated as "R-40," propylene glycol monomethyl ether acetate is abbreviated as "PGMEA," and propylene glycol monomethyl ether is abbreviated as "PGME." In Table 1, each component in the resist underlayer film-forming compositions of Examples 1 to 13 and Comparative Examples 1 to 4 is expressed in part by mass. The amount of the solvent was set to 100 parts by mass.

TABLE 1

| | Resin | Additive | cross-linking agent | Organic Acid 1 | Organic Acid 2 | Surfactant | Solvent |
|---|---|---|---|---|---|---|---|
| Example 1 (part by mass) | Synthesis Example 1 0.7 | Synthesis Example 4 0.1 | PL-LI 0.2 | PSA 0.02 | MSP 0.004 | R-40 0.01 | PGME:PGMEA 90:10 |
| Example 2 (part by mass) | Synthesis Example 1 0.7 | Synthesis Example 5 0.1 | PL-LI 0.2 | PSA 0.02 | MSP 0.004 | R-40 0.01 | PGME:PGMEA 90:10 |
| Example 3 (part by mass) | Synthesis Example 1 0.7 | Synthesis Example 6 0.1 | PL-LI 0.2 | PSA 0.02 | MSP 0.004 | R-40 0.01 | PGME:PGMEA 90:10 |
| Example 4 (part by mass) | Synthesis Example 1 0.7 | Synthesis Example 7 0.1 | PL-LI 0.2 | PSA 0.02 | MSP 0.004 | R-40 0.01 | PGME:PGMEA 90:10 |
| Example 5 (part by mass) | Synthesis Example 1 0.7 | Synthesis Example 8 0.1 | PL-LI 0.2 | PSA 0.02 | MSP 0.004 | R-40 0.01 | PGME:PGMEA 90:10 |
| Example 6 (part by mass) | Synthesis Example 1 0.7 | Synthesis Example 9 0.1 | PL-LI 0.2 | PSA 0.02 | MSP 0.004 | R-40 0.01 | PGME:PGMEA 90:10 |
| Example 7 (part by mass) | Synthesis Example 1 0.7 | Synthesis Example 10 0.1 | PL-LI 0.2 | PSA 0.02 | MSP 0.004 | R-40 0.01 | PGME:PGMEA 90:10 |

TABLE 1-continued

|  | Resin | Additive | cross-linking agent | Organic Acid 1 | Organic Acid 2 | Surfactant | Solvent |
|---|---|---|---|---|---|---|---|
| Example 8 (part by mass) | Synthesis Example 1 0.7 | Synthesis Example 11 0.1 | PL-LI 0.2 | PSA 0.02 | MSP 0.004 | R-40 0.01 | PGME:PGMEA 90:10 |
| Example 9 (part by mass) | Synthesis Example 1 0.7 | Synthesis Example 12 0.1 | PL-LI 0.2 | PSA 0.02 | MSP 0.004 | R-40 0.01 | PGME:PGMEA 90:10 |
| Example 10 (part by mass) | Synthesis Example 1 0.7 | Synthesis Example 13 0.1 | PL-LI 0.2 | PSA 0.02 | MSP 0.004 | R-40 0.01 | PGME:PGMEA 90:10 |
| Example 11 (part by mass) | Synthesis Example 1 0.7 | Synthesis Example 14 0.1 | PL-LI 0.2 | PSA 0.02 | MSP 0.004 | R-40 0.01 | PGME:PGMEA 90:10 |
| Example 12 (part by mass) | Synthesis Example 1 0.7 | Synthesis Example 7 0.07 | PL-LI 0.2 | PSA 0.02 | MSP 0.004 | R-40 0.01 | PGME:PGMEA 90:10 |
| Example 13 (part by mass) | Synthesis Example 2 0.7 | Synthesis Example 7 0.1 | PL-LI 0.2 | 5-SSA 0.02 | — | — | PGME:PGMEA 90:10 |
| Comparative Example 1 (part by mass) | Synthesis Example 1 0.7 | — | PL-LI 0.2 | PSA 0.02 | MSP 0.004 | R-40 0.01 | PGME:PGMEA 90:10 |
| Comparative Example 2 (part by mass) | Synthesis Example 2 0.7 | — | PL-LI 0.2 | 5-SSA 0.02 | — | — | PGME:PGMEA 90:10 |
| Comparative Example 3 (part by mass) | Synthesis Example 1 0.7 | Synthesis Example 15 0.1 | PL-LI 0.2 | PSA 0.02 | MSP 0.004 | R-40 0.01 | PGME:PGMEA 90:10 |
| Comparative Example 4 (part by mass) | Synthesis Example 2 0.7 | Synthesis Example 15 0.1 | PL-LI 0.2 | 5-SSA 0.02 | — | — | PGME:PGMEA 90:10 |

(Measurement of Optical Constant)

The resist underlayer film-forming composition prepared in each of Examples 1 to 13 and Comparative Examples 1 to 4 was applied onto a silicon wafer using a spinner. Each silicon wafer was heated on a hot plate at 205° C. for 1 minute to form each resist underlayer film (film thickness: 28 nm). The refractive index (n value) and the light absorption coefficient (k value, also referred to as extinction coefficient) of the resist underlayer films were measured at each wavelength of 193 nm and 248 nm using a spectroscopic ellipsometer (VUV-VASE VU-302, manufactured by J. A. Woollam Co.). In Table 2 below, n1 and k1 show the refractive index and the light absorption coefficient, respectively, at a wavelength of 193 nm, and n2 and k2 show the refractive index and the light absorption coefficient, respectively, at a wavelength of 248 nm.

TABLE 2

|  | n1 | k1 | n2 | k2 |
|---|---|---|---|---|
| Example 1 | 1.89 | 0.31 | 1.69 | 0.01 |
| Example 2 | 1.90 | 0.31 | 1.69 | 0.01 |
| Example 3 | 1.91 | 0.31 | 1.69 | 0.01 |
| Example 4 | 1.89 | 0.31 | 1.68 | 0.02 |
| Example 5 | 1.91 | 0.31 | 1.69 | 0.01 |
| Example 6 | 1.90 | 0.31 | 1.69 | 0.02 |
| Example 7 | 1.90 | 0.30 | 1.69 | 0.02 |
| Example 8 | 1.91 | 0.31 | 1.69 | 0.01 |
| Example 9 | 1.90 | 0.30 | 1.69 | 0.02 |
| Example 10 | 1.90 | 0.31 | 1.69 | 0.01 |
| Example 11 | 1.91 | 0.30 | 1.69 | 0.01 |
| Example 12 | 1.92 | 0.30 | 1.69 | 0.01 |
| Example 13 | 1.89 | 0.29 | 1.69 | 0.01 |
| Comparative Example 1 | 1.94 | 0.28 | 1.69 | 0.01 |
| Comparative Example 2 | 1.95 | 0.26 | 1.70 | 0.01 |
| Comparative Example 3 | 1.89 | 0.32 | 1.69 | 0.01 |
| Comparative Example 4 | 1.90 | 0.30 | 1.70 | 0.01 |

(Formation of Resist Pattern by ArF Exposure)

The resist underlayer film-forming composition prepared in each of Examples 1 to 13 and Comparative Examples 1 to 4 was applied onto a silicon wafer using a spinner. Each silicon wafer was baked on a hot plate at 205° C. for 60 seconds to form a resist underlayer film having a film thickness of 28 nm. Onto the resist underlayer film, a positive resist solution for ArF excimer laser was applied by spin coating, and heated at 80° C. for 60 seconds to form an ArF resist film. The resist film was exposed by an exposure device for ArF excimer laser (NSR S307R, manufactured by Nikon Corporation) under a predetermined condition. After the exposure, the film was baked (PEB) at 95° C. for 60 seconds, cooled to room temperature on a cooling plate, developed by butyl acetate, and rinsed with butyl acetate, to form a line-and-space resist pattern. Since butyl acetate, not an aqueous alkaline solution, was used as a developer, use of water in a rinsing treatment is not appropriate. The appropriateness of formation of line-and-space (hereinafter abbreviated as L/S) patterns of 62 nm and 45 nm, and the pattern shape of L/S of 62 nm by observation of cross section of the pattern were evaluated by a scanning electron microscopy (S-4800, manufactured by Hitachi High-Tech Fielding Corporation). The results are shown in Table 3 and FIG. 1.

TABLE 3

| | Formation of 62 nm L/S | Formation of 45 nm L/S | Pattern shape of 62 nm L/S |
|---|---|---|---|
| Example 1 | Possible | Possible | Straight |
| Example 2 | Possible | Possible | Straight |
| Example 3 | Possible | Possible | Straight |
| Example 4 | Possible | Possible | Straight |
| Example 5 | Possible | Possible | Straight |
| Example 6 | Possible | Possible | Straight |
| Example 7 | Possible | Possible | Straight |
| Example 8 | Possible | Possible | Straight |
| Example 9 | Possible | Possible | Straight |
| Example 10 | Possible | Possible | Straight |
| Example 11 | Possible | Possible | Straight |
| Example 12 | Possible | Possible | Straight |
| Example 13 | Possible | Possible | Straight |
| Comparative Example 1 | Possible | Impossible | Undercut |
| Comparative Example 2 | Possible | Impossible | Undercut |
| Comparative Example 3 | Possible | Possible | Footing |
| Comparative Example 4 | Possible | Possible | Footing |

The pattern shapes of 62 nm L/S formed using the resist underlayer film-forming compositions prepared in Examples 1 to 13 were a straight shape, which were not an undercut or footing shape. Pattern collapse was not observed. In contrast, the pattern shapes of 62 nm L/S formed using the resist underlayer film-forming compositions prepared in Comparative Examples 1 to 4 were an undercut or footing shape. Formation of pattern of 45 nm L/S was impossible when the resist underlayer film-forming compositions prepared in Comparative Examples 1 and 2 were only used.

BRIEF DESCRIPTION OF DRAWINGS

FIG. 1 is SEM images illustrating results in which cross sections of resist pattern of 62 nm L/S formed on the resist underlayer film formed on the silicon wafer using the resist underlayer film-forming compositions prepared in Examples 1 to 13 and Comparative Examples 1 to 4 were observed by a scanning electron microscope (SEM).

The invention claimed is:

1. An additive for a resist underlayer film-forming composition comprising a copolymer having structural units of Formulae (1) to (4):

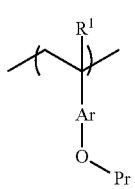

(1)

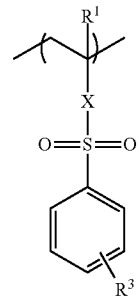

(2)

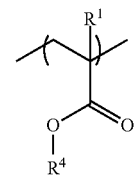

(3)

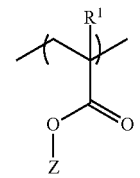

(4)

where
  each $R^1$ is independently a hydrogen atom or methyl group,
  Ar is arylene group,
  Pr is a hydrogen atom or a protecting group selected from an acetyl group, a methoxymethyl group, an ethoxyethyl group, a $C_{4-8}$ tertiary alkyl group, or a pivaloyl group,
  X is a direct bond or a —C(=O)O—$R^2$— group,
  $R^2$ constituting the —C(=O)O—$R^2$— group is a $C_{1-3}$ alkylene group, the alkylene group is bonded to a sulfur atom,
  $R^3$ is a hydrogen atom, methyl group, methoxy group, or halogeno group,
  $R^4$ is a $C_{1-3}$ alkyl group in which at least one hydrogen atom is substituted with a fluoro group, and
  Z is an organic group having 4 to 7-membered ring lactone skeleton, adamantane skeleton, or norbornane skeleton.

2. The additive according to claim 1, wherein in the structural unit of Formula (1), Pr is the protecting group selected from an acetyl group, a methoxymethyl group, an ethoxyethyl group, a $C_{4-8}$ tertiary alkyl group, or a pivaloyl group.

3. The additive according to claim 1, wherein the structural unit of Formula (2) is a structural unit of Formula (2a) or Formula (2b):

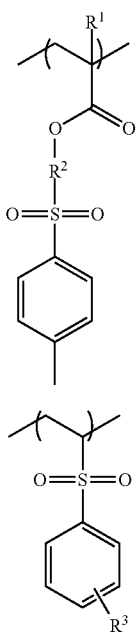

(2a)

(2b)

where
R$^1$, R$^2$, and R$^3$ each have the same definition as in claim 1.

4. The additive according to claim 1, wherein the structural unit of Formula (4) is a structural unit of Formula (4a):

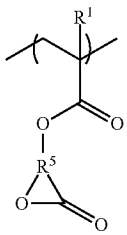

(4a)

where
  each R$^1$ is independently a hydrogen atom or methyl group, and
  R$^5$ is a C$_{2-5}$ hydrocarbon group.

5. The additive according to claim 1, wherein
  the copolymer is a compound synthesized by copolymerization of a monomer forming the structural unit of Formula (1), a monomer forming the structural unit of Formula (2), a monomer forming the structural unit of Formula (3), and a monomer forming the structural unit of Formula (4), and
  the content of the monomer forming the structural unit of Formula (2) is 5% by mole to 40% by mole relative to a total of the four monomers of 100% by mole.

6. The additive according to claim 1, wherein the copolymer has a weight average molecular weight of 3,000 to 20,000.

7. A resist underlayer film-forming composition containing
  the additive according to claim 1,
  a resin different from the copolymer,
  an organic acid,
  a cross-linking agent, and
  a solvent.

8. The resist underlayer film-forming composition according to claim 7, wherein the resin is polyester.

9. The resist underlayer film-forming composition according to claim 7, wherein
  the additive is contained in an amount of 5 parts by mass to 20 parts by mass relative to 100 parts by mass of the resin.

10. A method for forming a resist pattern comprising the steps of:
  forming a resist underlayer film on a substrate using the resist underlayer film-forming composition according to claim 7;
  forming a resist film on the resist underlayer film using a positive resist solution;
  exposing the resist film through a photomask; and
  developing the resist film by a solvent capable of dissolving an unexposed area of the resist film after the exposure, to remove the unexposed area.

\* \* \* \* \*